(12) United States Patent
Okawa et al.

(10) Patent No.: US 9,368,555 B2
(45) Date of Patent: Jun. 14, 2016

(54) SEMICONDUCTOR MEMORY DEVICE

(71) Applicant: Kabushiki Kaisha Toshiba, Minato-ku (JP)

(72) Inventors: Takamasa Okawa, Yokkaichi (JP); Takayuki Tsukamoto, Yokkaichi (JP); Yoichi Minemura, Yokkaichi (JP); Hiroshi Kanno, Yokkaichi (JP); Atsushi Yoshida, Yokkaichi (JP); Hideyuki Tabata, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/178,636

(22) Filed: Feb. 12, 2014

(65) Prior Publication Data

US 2015/0103582 A1    Apr. 16, 2015

Related U.S. Application Data

(60) Provisional application No. 61/890,922, filed on Oct. 15, 2013.

(51) Int. Cl.
*H01L 27/24* (2006.01)
*G11C 13/00* (2006.01)
*H01L 45/00* (2006.01)

(52) U.S. Cl.
CPC .......... *H01L 27/249* (2013.01); *G11C 13/0002* (2013.01); *G11C 13/0026* (2013.01); *G11C 13/0069* (2013.01); *H01L 27/2454* (2013.01); *G11C 2013/0073* (2013.01); *G11C 2213/71* (2013.01); *H01L 45/04* (2013.01); *H01L 45/12* (2013.01); *H01L 45/1226* (2013.01); *H01L 45/146* (2013.01)

(58) Field of Classification Search
CPC .... G11C 11/56; G11C 13/0002; H01L 45/00; H01L 27/294
USPC ..................................... 365/63, 148
See application file for complete search history.

(56) References Cited

U.S. PATENT DOCUMENTS

| | | | |
|---|---|---|---|
| 7,800,091 B2 | 9/2010 | Kamigaichi et al. | |
| 7,910,914 B2 | 3/2011 | Tanaka et al. | |
| 8,194,434 B2 * | 6/2012 | Toda ..................... | G11C 5/025 365/148 |
| 2008/0175032 A1 * | 7/2008 | Tanaka et al. ................. | 365/51 |

(Continued)

FOREIGN PATENT DOCUMENTS

| | | |
|---|---|---|
| JP | 2008-181978 | 8/2008 |
| JP | 2008-277543 | 11/2008 |
| JP | 2010-287872 | 12/2010 |

*Primary Examiner* — Huan Hoang
*Assistant Examiner* — Muna A Techane
(74) *Attorney, Agent, or Firm* — Oblon, McClelland, Maier & Neustadt, L.L.P.

(57) ABSTRACT

This semiconductor memory device comprises a memory cell array that includes: a plurality of first lines; a plurality of second lines intersecting the plurality of first lines; a plurality of memory cells each disposed at an intersection of the plurality of first lines and the plurality of second lines and including a variable resistance element; and a select transistor respectively connected to an end of the plurality of first lines. The select transistor includes a gate electrode, a gate insulating film, and a conductive layer. Moreover, one end of that conductive layer is connected to the end of the first line, and a non-linear resistance layer configured from a non-linear material is connected between the first line and the conductive layer.

16 Claims, 16 Drawing Sheets

(56) References Cited

U.S. PATENT DOCUMENTS

| | | | |
|---|---|---|---|
| 2010/0219392 A1* | 9/2010 | Awaya et al. | 257/3 |
| 2012/0170353 A1* | 7/2012 | Iijima et al. | 365/148 |
| 2013/0210211 A1* | 8/2013 | Vereen | H01L 45/1233 438/382 |
| 2014/0117304 A1* | 5/2014 | Park | 257/4 |
| 2014/0254242 A1* | 9/2014 | Siau | G11C 13/0026 365/148 |
| 2014/0321193 A1* | 10/2014 | Park | 365/148 |
| 2014/0353573 A1* | 12/2014 | Kalra et al. | 257/5 |

* cited by examiner

SEMICONDUCTOR MEMORY DEVICE

CROSS REFERENCE TO RELATED APPLICATIONS

This application is based on and claims the benefit of priority from prior U.S. prior provisional Patent Application No. 61/890,922, filed on Oct. 15, 2013, the entire contents of which are incorporated herein by reference.

FIELD

Embodiments relate to a semiconductor memory device.

BACKGROUND

In recent years, ReRAM (Resistive RAM) that uses as memory a variable resistance element whose resistance value can be reversibly changed, has been proposed. Moreover, in this ReRAM, a memory cell array has a structure in which the variable resistance element is provided between a sidewall of a word line extending parallel to a substrate and a sidewall of a bit line extending perpendicularly to the substrate.

However, in this structure, the number of memory cells connected to one bit line becomes large. Therefore, there is a possibility that a current flowing via an unselected select transistor increases. Then, it causes increased probability of misreading of data from a selected memory cell.

DETAILED DESCRIPTION

A semiconductor memory device according to an embodiment described below comprises a memory cell array that includes: a plurality of first lines; a plurality of second lines intersecting the plurality of first lines; a plurality of memory cells each disposed at an intersection of the plurality of first lines and the plurality of second lines and including a variable resistance element; and a select transistor respectively connected to an end of the plurality of first lines. The select transistor includes a gate electrode, a gate insulating film, and a conductive layer. One end of that conductive layer is connected to the end of the first line, and a non-linear resistance layer configured from a non-linear material is connected between the first line and the conductive layer.

[Configuration]

Figure 1:
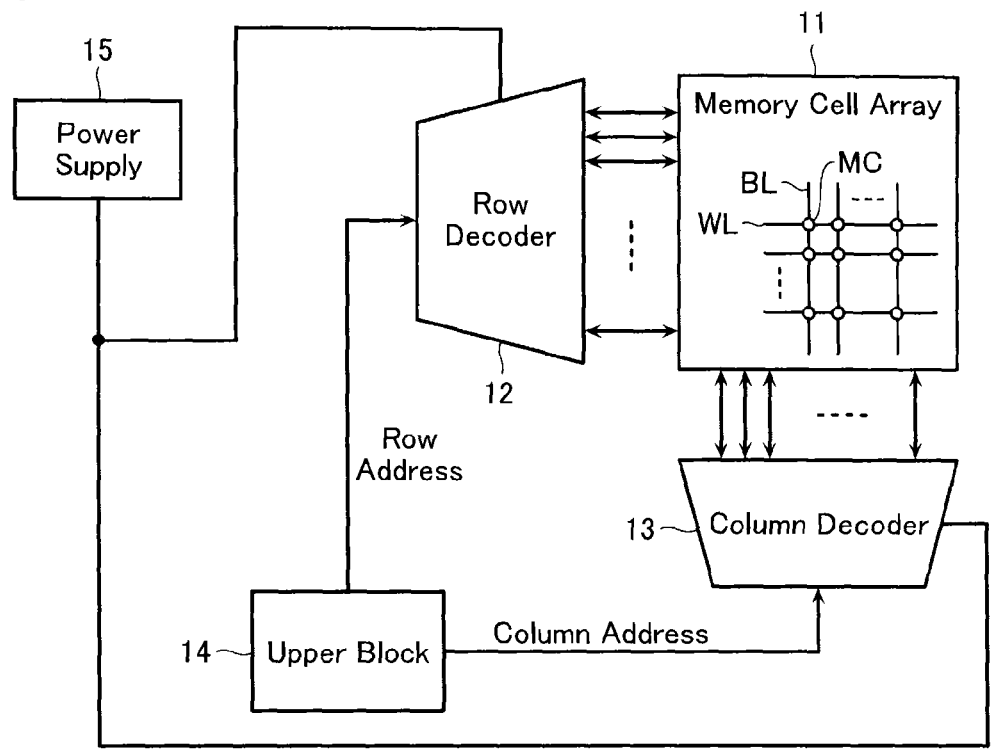
FIG. 1 is an example of a block diagram of a semiconductor memory device according to a first embodiment.

First, an overall configuration of the semiconductor memory device according to the embodiment will be described. FIG. 1 is an example of a block diagram of the semiconductor memory device according to the embodiment. As shown in FIG. 1, the semiconductor memory device includes a memory cell array 11, a row decoder 12, a column decoder 13, an upper block 14, and a power supply 15.

The memory cell array 11 includes word lines WL and bit lines BL that intersect each other, and a memory cell MC disposed at each of intersections of these word lines WL and bit lines BL. The row decoder 12 selects the word line WL during access (data erase/write/read). The column decoder 13 selects the bit line BL during access and includes a driver that controls an access operation.

The upper block 14 includes a control circuit that governs control of the memory device overall and selects the memory cell MC which is to be an access target in the memory cell array 11. The upper block 14 respectively provides a row address and a column address to the row decoder 12 and the column decoder 13. The power supply generates a combination of certain voltages corresponding to each of operations of data erase/write/read, and supplies the combination of voltages to the row decoder 12 and the column decoder 13.

Figure 2:
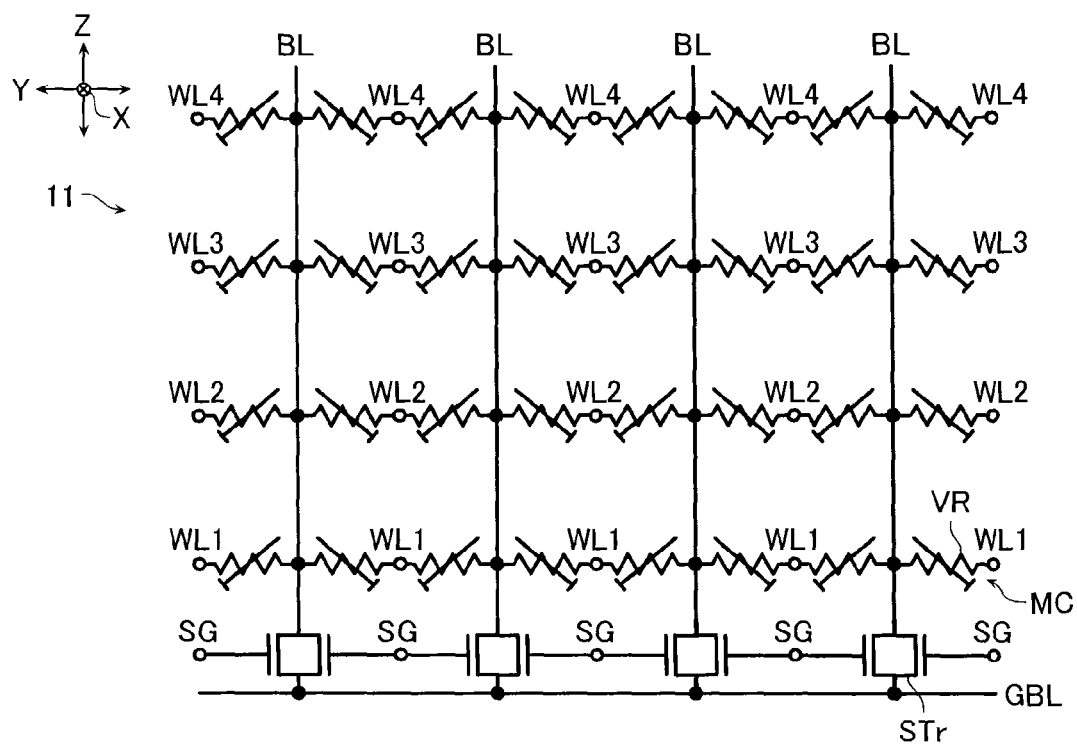
FIG. 2 is an example of a circuit diagram of a memory cell array 11 according to the first embodiment.

Next, the memory cell array 11 according to the embodiment will be described in detail with reference to FIG. 2. FIG. 2 is a circuit diagram of the memory cell array 11. Note that in FIG. 2, an X direction, a Y direction, and a Z direction are orthogonal to each other, and the X direction is a direction perpendicular to a plane of paper. Moreover, a structure shown in FIG. 2 is provided repeatedly in the X direction.

As shown in FIG. 2, the memory cell array 11 includes a select transistor STr, a global bit line GBL, and a select gate (line) SG, besides the above-mentioned bit line BL, word line WL, and memory cell MC.

As shown in FIG. 2, word lines WL1 to WL4 are arranged with a certain pitch in the Z direction and extend having the X direction as a longer direction. The bit lines BL are arranged in a matrix in the X direction and the Y direction and extend having the Z direction as a longer direction. The memory cell MC is disposed at an intersection between these word lines WL and bit lines BL. Therefore, the memory cells MC are arranged in a three-dimensional matrix in the X, Y, and Z directions.

As shown in FIG. 2, the memory cell MC includes a variable resistance element VR. The variable resistance element VR is electrically rewritable and stores data in a nonvolatile manner based on a resistance value. The variable resistance element VR attains a low-resistance state (set state) by a setting operation that applies both terminals of the variable resistance element VR with a certain voltage or more, and attains a high-resistance state (reset state) by a resetting operation that applies both terminals of the variable resistance element VR with a certain voltage or more.

In addition, the variable resistance element VR is in a high-resistance state and does not change its resistance state easily immediately after manufacturing. Accordingly, a forming operation is executed that applies both terminals of the variable resistance element VR with a high voltage greater than or equal to that of the setting operation and resetting operation. Due to this forming operation, a region (filament path) where locally current flows easily in the variable resistance element VR is formed, whereby the variable resistance element VR can easily change its resistance state and attains a state of being operable as a memory element.

As shown in FIG. 2, the select transistor STr is provided between the global bit line GBL and one end of the bit line BL. The global bit lines GBL are arranged with a certain pitch in the X direction and extend having the Y direction as a longer direction. One global bit line GBL is commonly connected to one ends of the plurality of select transistors STr arranged in a line in the Y direction and extends having the Y direction as a longer direction. The select gate lines SG are arranged with a certain pitch in the Y direction and extend having the X direction as a longer direction. One select gate line SG is commonly connected to gates of the plurality of select transistors STr arranged in a line in the X direction.

Figure 3:
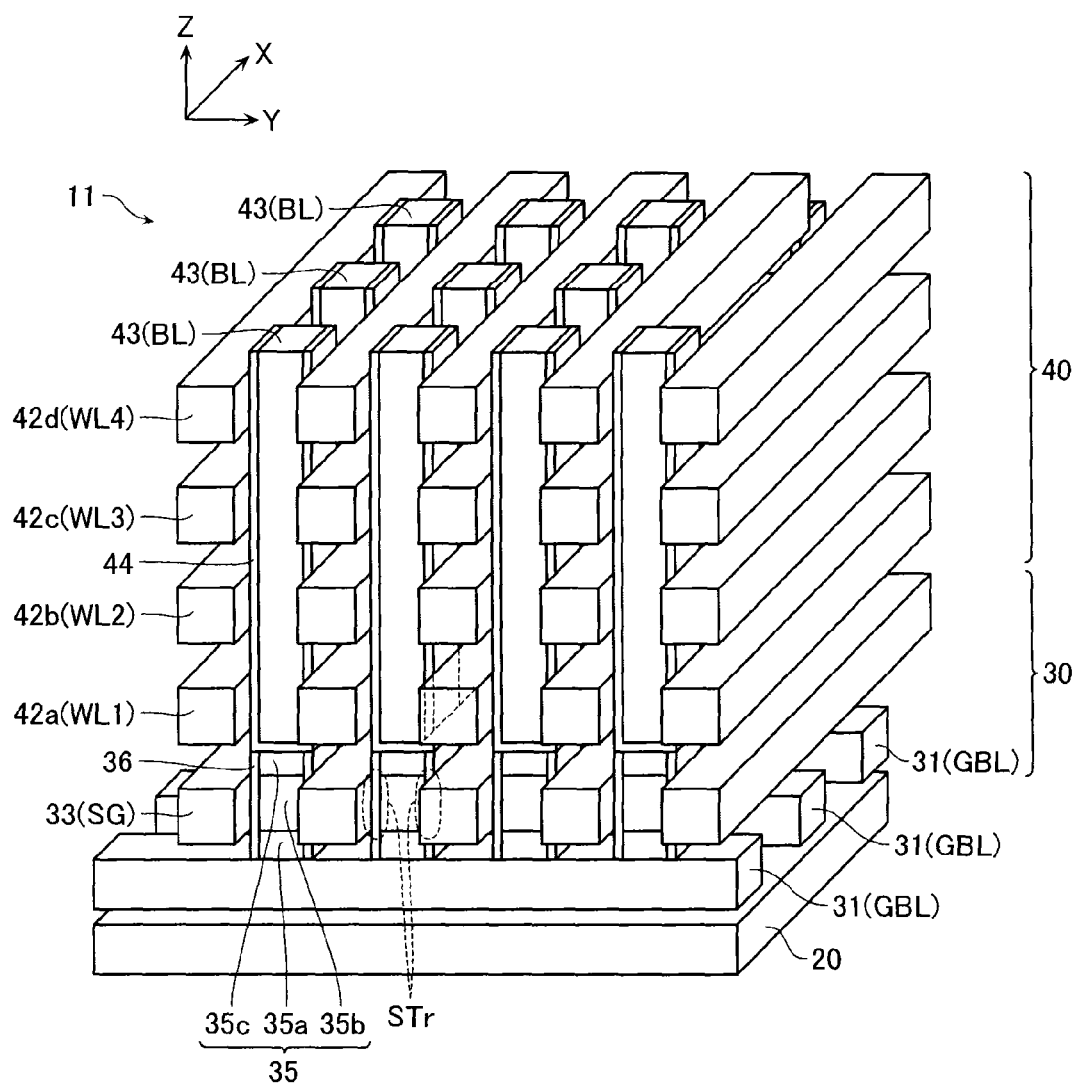
FIG. 3 is an example of a perspective view showing a stacked structure of the memory cell array 11 according to the first embodiment.
Figure 4:
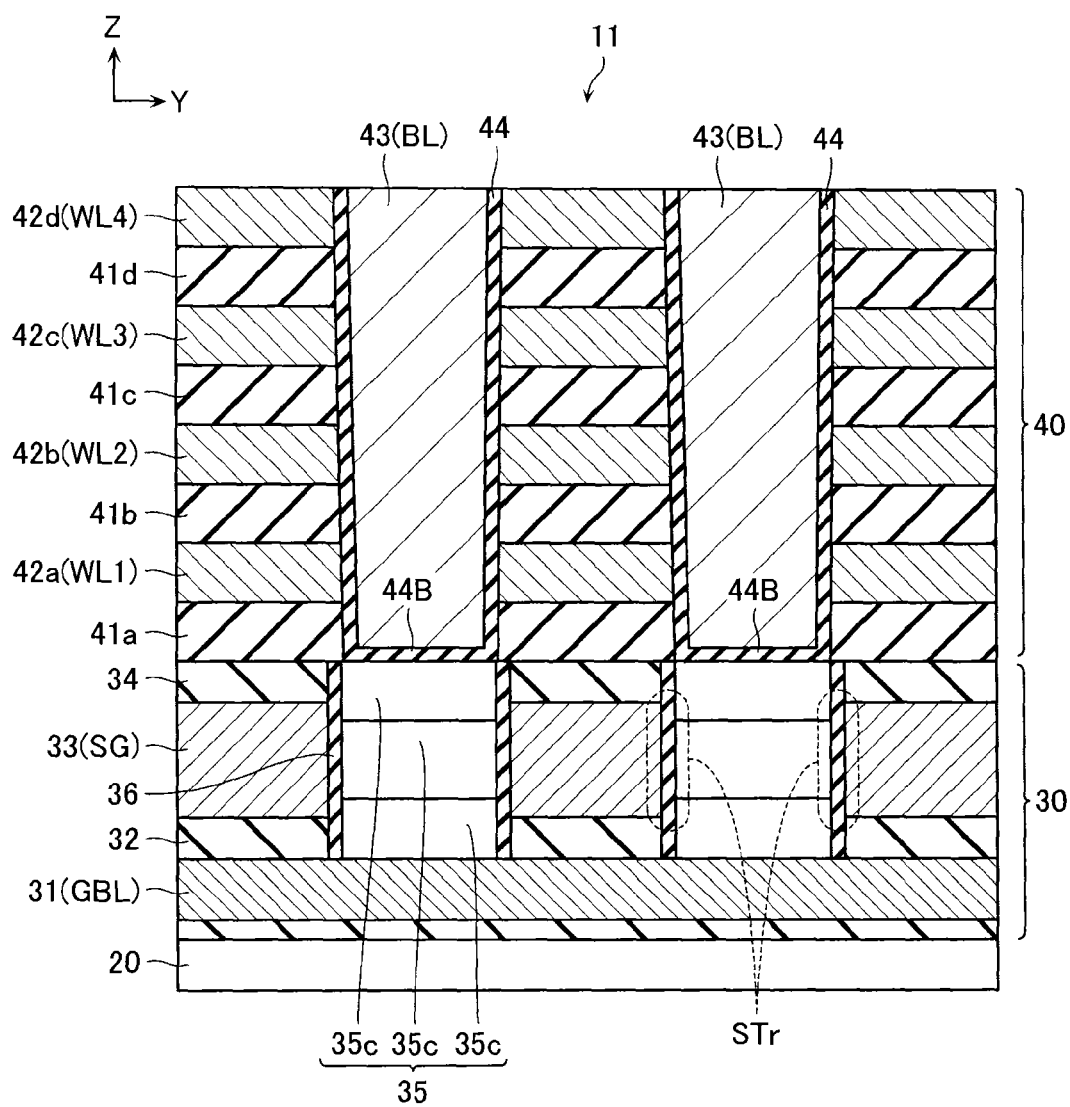
FIG. 4 is an example of a cross-sectional view of FIG. 3.
Figure 5:
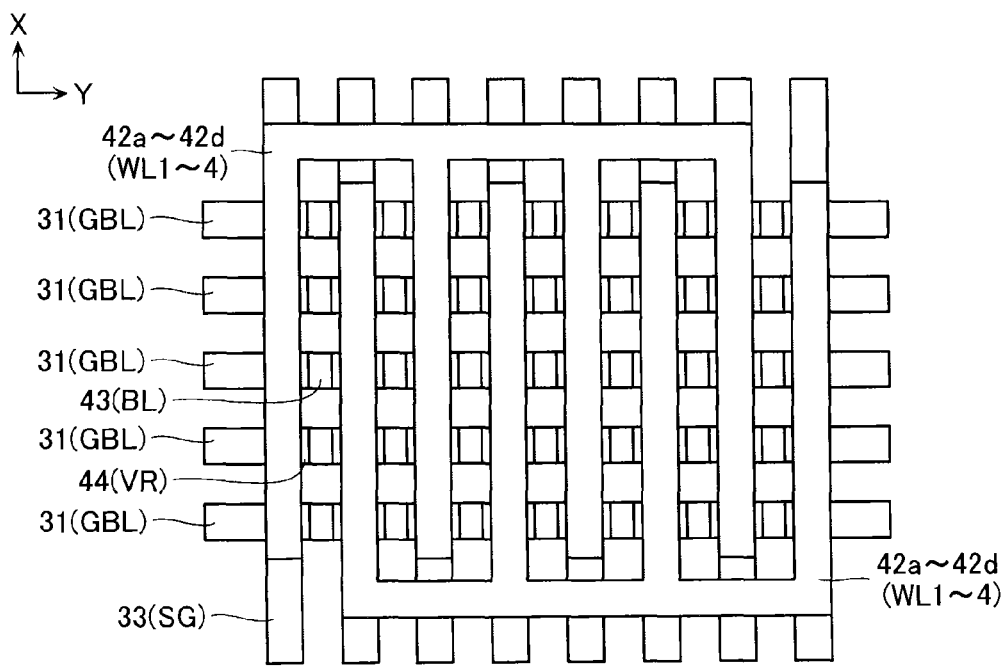
FIG. 5 is an example of a top view of FIG. 3.

Next, a stacked structure of the memory cell array 11 according to the embodiment will be described with reference to FIGS. 3 to 5. FIG. 3 is an example of a perspective view showing the stacked structure of the memory cell array 11. FIG. 4 is an example of a cross-sectional view of FIG. 3, and FIG. 5 is an example of a top view of FIG. 3. Note that an interlayer insulating layer is omitted in FIGS. 3 and 5.

As shown in FIGS. 3 and 4, the memory cell array 11 includes a select transistor layer 30 and a memory layer 40 that are stacked on a substrate 20. The select transistor layer 30 functions as the select transistor STr, and the memory layer 40 functions as the memory cell MC.

As shown in FIGS. 3 and 4, the select transistor layer 30 includes a conductive layer 31, an interlayer insulating layer 32, a conductive layer 33, and an interlayer insulating layer 34. The conductive layers 31 are stripe-shaped lines aligned with a certain pitch in the X direction parallel to the substrate 20 and extending in the Y direction as a longer direction, and function as the global bit line GBL. On the other hand, the conductive layer 33 is formed above the conductive layer 31 via the interlayer insulating layer 32. The conductive layers 33 are formed as stripe-shaped lines aligned with a certain pitch in the Y direction and extending in the X direction as a longer direction, and function as the select gate line SG and as a gate of the select transistor STr.

Note that in the device of this embodiment, each of the conductive layers 33 had a striped shape being capable of independently voltage-controlled. In addition, each of the conductive layers 33 faces different semiconductor layers 35 left and right side surfaces of the conductive layer 33, via gate insulating films 36. In other words, one conductive layer 33 (select gate line) functions as a gate electrode of the two select transistors positioned on the left and right of the conductive layer 33.

The interlayer insulating layer 34 covers an upper surface of the conductive layer 33. The conductive layers 31 and 33 are formed of, for example, polysilicon. The interlayer insulating layers 32 and 34 are formed of silicon oxide ($SiO_2$).

In addition, as shown in FIGS. 3 and 4, the select transistor layer 30 includes the semiconductor layer 35 and the gate insulating layer 36. The semiconductor layer 35 functions as a body (channel) of the select transistor STr, and the gate insulating layer 36 functions as a gate insulating film of the select transistor STr. As an example, the semiconductor layers 35 are disposed in a matrix in the X and Y directions and extend in a column shape in the Z direction. Moreover, the semiconductor layer 35 contacts an upper surface of the conductive layer 31 and contacts a side surface of the conductive layer 33 at an end in the Y direction of the conductive layer 33 via the gate insulating layer 36. In addition, the semiconductor layer 35 includes an N+ type semiconductor layer 35a, a P+ type semiconductor layer 35b, and an N+ type semiconductor layer 35c that are stacked.

As shown in FIGS. 3 and 4, the N+ type semiconductor layer 35a contacts the interlayer insulating layer 32 at a side surface of the N+ type semiconductor layer 35a at an end in the Y direction of the N+ type semiconductor layer 35a. The P+ type semiconductor layer 35b contacts the side surface of the conductive layer 33 at a side surface of the P+ type semiconductor layer 35b at an end in the Y direction of the P+ type semiconductor layer 35b. The N+ type semiconductor layer 35c contacts the interlayer insulating layer 34 at a side surface of the N+ type semiconductor layer 35c at an end in the Y direction of the N+ type semiconductor layer 35c. The N+ type semiconductor layers 35a and 35c are formed of polysilicon implanted with an N+ type impurity, and the P+ type semiconductor layer 35b is formed of polysilicon implanted with a P+ type impurity. The gate insulating layer 36 is formed of, for example, silicon oxide ($SiO_2$).

As shown in FIGS. 3 and 4, the memory layer 40 includes interlayer insulating layers 41a to 41d and conductive layers 42a to 42d that are stacked alternately in the Z direction. The conductive layers 42a to 42d function as the word lines WL1 to WL4.

As shown in FIG. 5, the conductive layers 42a to 42d each include a pair of comb tooth shapes that face each other in the X direction. The interlayer insulating layers 41a to 41d are formed of, for example, silicon oxide ($SiO_2$), and the conductive layers 42a to 42d are formed of, for example, polysilicon.

In addition, as shown in FIGS. 3 and 4, the memory layer 40 includes a second conductive layer 43 and a variable resistance layer 44. As an example, the second conductive layers 43 are disposed in a matrix in the X and Y directions, contact an upper surface of the semiconductor layer 35, and extend in a column shape in the Z direction, and function as the bit line BL.

The variable resistance layer 44 is provided with a film thickness of, for example, about several nm, on a side surface of the second conductive layer 43 at an end in the Y direction of the second conductive layer 43 and on a bottom surface of the second conductive layer 43. The second conductive layer 43 is formed of, for example, polysilicon, and the variable resistance layer is formed of, for example, a metal oxide. More specifically, the variable resistance layer 44 is formed of $HfO_x$, $Al_2O_x$, $TiO_x$, $NiO_x$, $WO_x$, $Ta_2O_x$, or the like.

As described above, in the present embodiment, the variable resistance layer 44 (variable resistance element VR) is provided between the side surfaces of the conductive layers 42a to 42d (word lines WL) extending parallel to the substrate 20 and the side surface of the second conductive layer 43 (bit line BL) extending perpendicularly to the substrate 20. Accordingly, the present embodiment can have the memory cell array 11 highly integrated. This variable resistance layer 44 is formed also at a position between the semiconductor layer 35 and the second conductive layer 43 (that is, on a bottom of the second conductive layer 43). A portion of this variable resistance layer 44 formed on the bottom of the second conductive layer 43 is referred to below as a "non-linear resistance layer 44B". In a read operation of the memory cell MC and so on, a current flows from the global bit line GBL to the bit line BL flows via this non-linear resistance layer 44B. Moreover, this non-linear resistance layer 44B has a non-linear voltage-current characteristic compared to the semiconductor layer 35. Due to the presence of this non-linear resistance layer 44B, it is possible to increase a read margin, and to reduce misread of data in a read operation. This will be described in detail later.

[Manufacturing Method]

Next, an example of a manufacturing method of the semiconductor memory device according to the embodiment will be described with reference to FIGS. 6 to 14. FIGS. 6 to 14 are perspective views showing a first manufacturing method of the memory cell array 11. Note that in the manufacturing method which will be described below, only a manufacturing method of the memory layer 40 will be shown. A manufacturing method of the select transistor layer 30 may be identical to a well-known method, hence a description thereof will be omitted.

Figure 6:
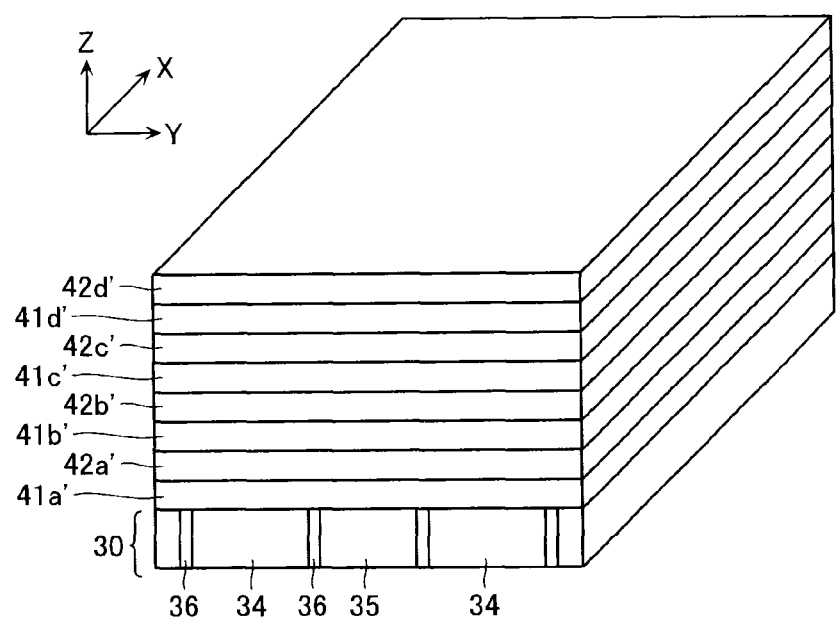
FIG. 6 is an example of a perspective view showing a first manufacturing method of the memory cell array 11 according to the first embodiment.

First, as shown in FIG. 6, silicon oxide ($SiO_2$) and polysilicon (Si) are stacked alternately on an upper surface of the select transistor layer 30 to form interlayer insulating layers 41a' to 41d' and conductive layers 42a' to 42d' extending in the X direction and the Y direction.

Figure 7:
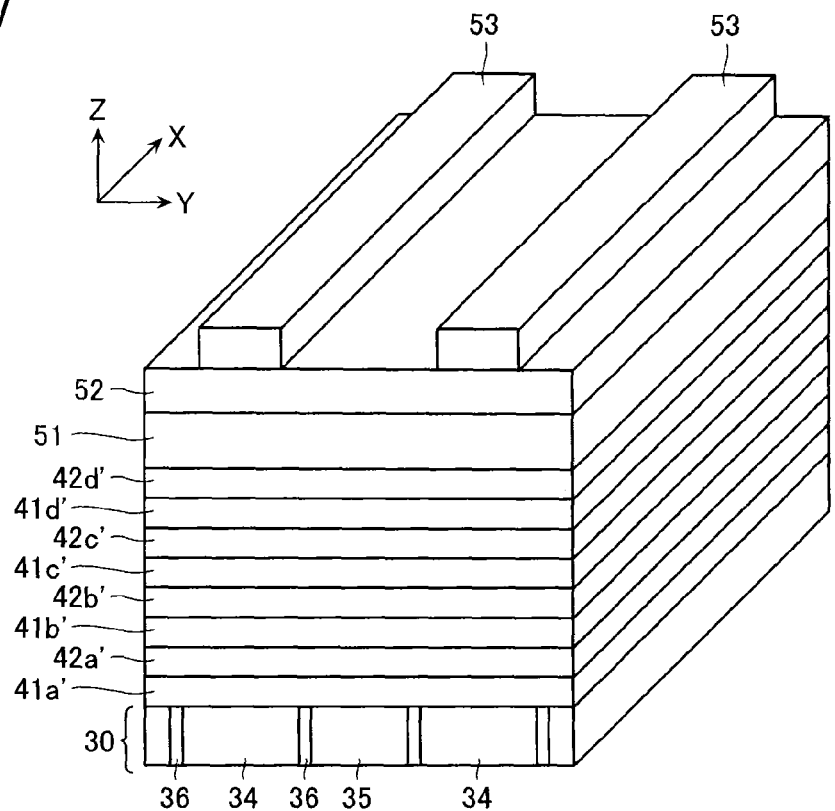
FIG. 7 is an example of a perspective view showing the first manufacturing method of the memory cell array 11 according to the first embodiment.

Following this, as shown in FIG. 7, insulating layers 51 and 52 are stacked on the conductive layer 42d'. Then, an etching mask 53 is stacked on an upper surface of the insulating layer 52. The etching masks 53 are formed using a photo-etching process and reactive ion etching to be aligned with a certain pitch in the Y direction and extend in the X direction.

Figure 8:
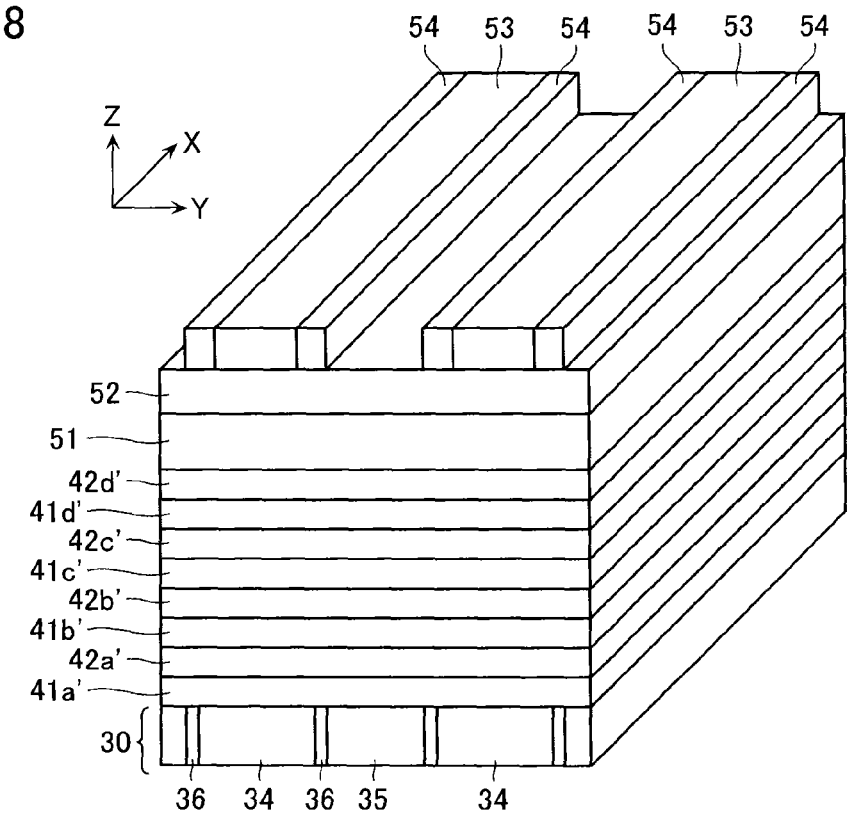
FIG. 8 is an example of a perspective view showing the first manufacturing method of the memory cell array 11 according to the first embodiment.

Subsequently, as shown in FIG. 8, a mask material is deposited above the insulating layer 52 and the etching mask 53 and then etching-back is performed. This etching-back causes a sidewall mask 54 to be formed on a side surface of the etching mask 53 at an end in the Y direction of the etching mask 53.

Figure 9:
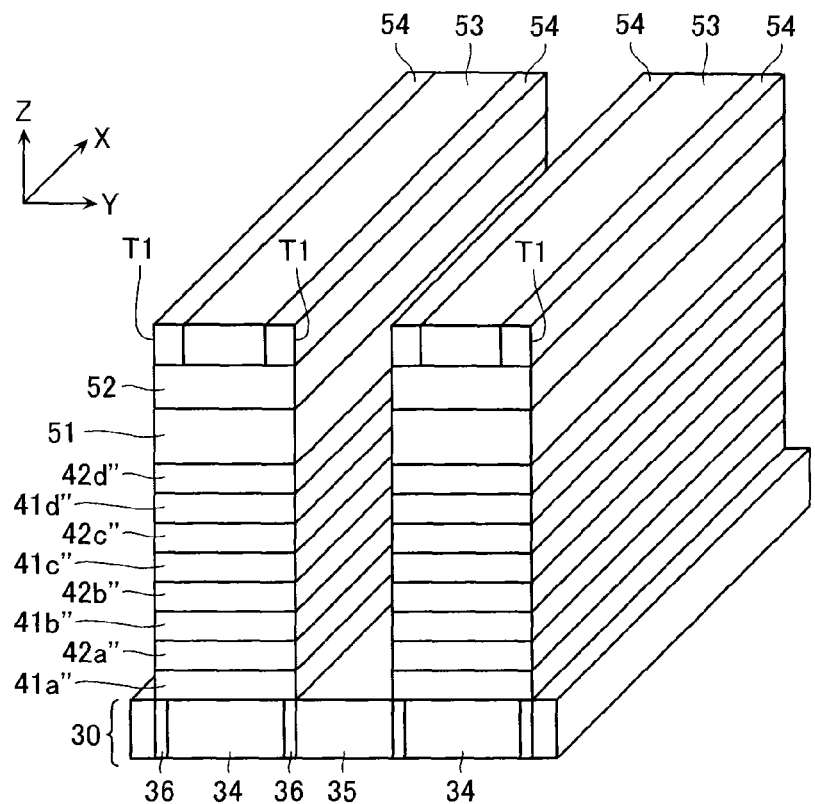
FIG. 9 is an example of a perspective view showing the first manufacturing method of the memory cell array 11 according to the first embodiment.

Following this, as shown in FIG. 9, the interlayer insulating layers 41a' to 41d' and the conductive layers 42a' to 42d' are etched using the etching mask 53 and the sidewall mask 54 as a mask to form a trench T1. This trench T1 reaches the upper surface of the select transistor layer 30 and the upper surface of the select transistor layer 30 is exposed. The trench T1 results in the interlayer insulating layers 41a' to 41d' and the conductive layers 42a' to 42d' becoming interlayer insulating layers 41a" to 41d" and conductive layers 42a" to 42d" that are processed in a shape aligned with a certain pitch in the Y direction and extending in the X direction.

Figure 10:
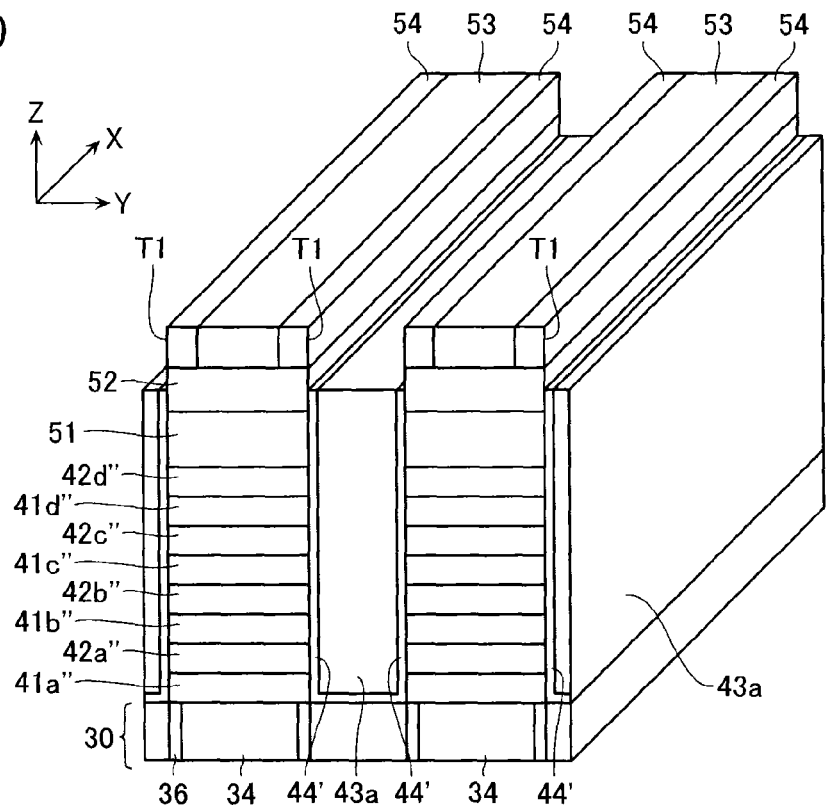
FIG. 10 is an example of a perspective view showing the first manufacturing method of the memory cell array 11 according to the first embodiment.

Subsequently, as shown in FIG. 10, a variable resistance layer 44' is formed on a side surface of the interlayer insulating layers 41a" to 41d" and the conductive layers 42a" to 42d" facing the trench T1 and on a bottom surface of the trench T1. The variable resistance layer 44' is formed by a good isotropic method (for example, an atomic layer deposition method (ALD method)). Note that the variable resistance layer 44' is configured by $HfO_2$, $Al_2O_3$, $TiO_2$, NiO, $WO_3$, $Ta_2O_5$, or the like. Then, conductive polysilicon (Si) is deposited to fill the trench T1, thereby forming the conductive layer 43a. The conductive layer 43a is deposited in a state where the variable resistance layer 44' has been left not only on the side surface of the trench T1 but also on the bottom surface of the trench T1.

Figure 11:
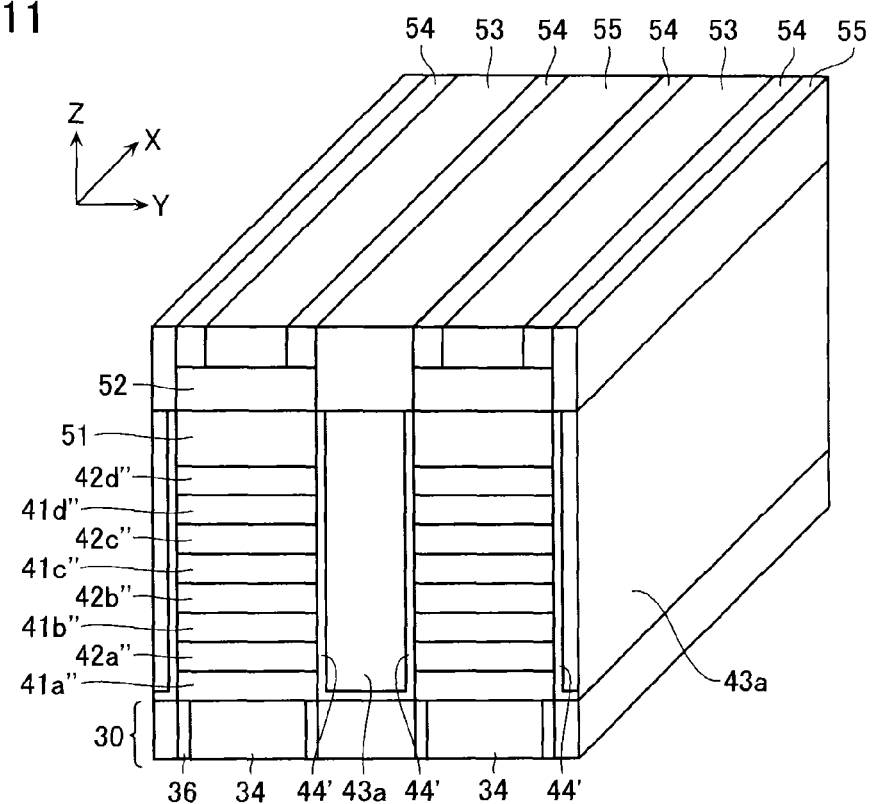
FIG. 11 is an example of a perspective view showing the first manufacturing method of the memory cell array 11 according to the first embodiment.

Following this, as shown in FIG. 11, an etching mask 55 which will be used in a later process is deposited on the variable resistance layer 44' and the conductive layer 43a. Then, the etching masks 55 and 53 and the sidewall mask 54 are planarized by CMP (Chemical Mechanical Polishing).

Figure 12:
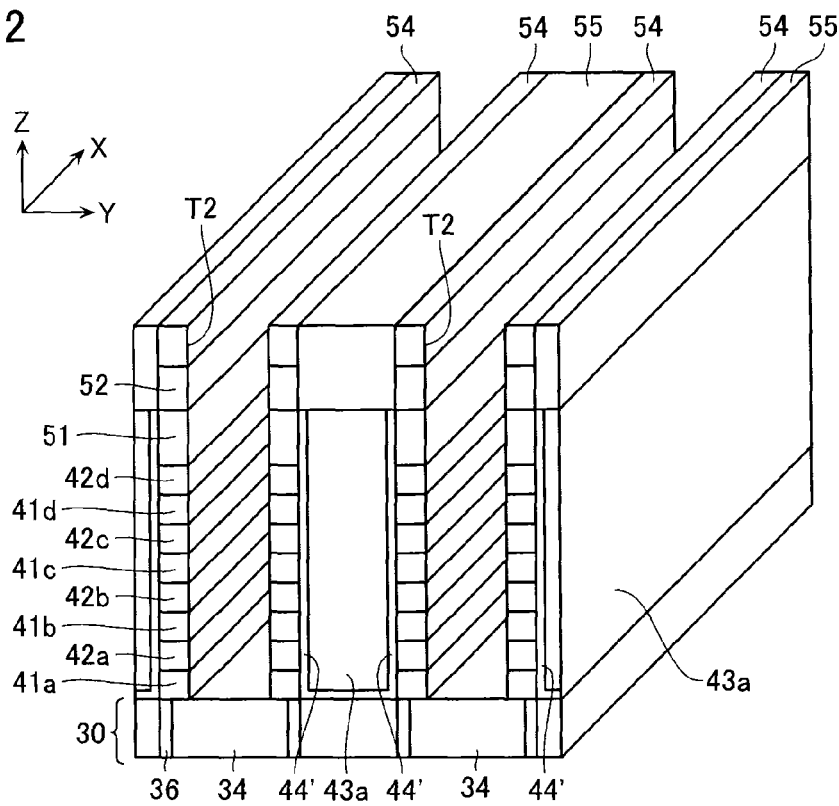
FIG. 12 is an example of a perspective view showing the first manufacturing method of the memory cell array 11 according to the first embodiment.

Next, as shown in FIG. 12, the etching mask 53 is only removed. Then, the interlayer insulating layers 41a" to 41d" and the conductive layers 42a' to 42d' are etched using the etching mask 55 and the sidewall mask 54 as a mask to form a trench T2. This trench T2 reaches the upper surface of the select transistor layer 30. The trench T2 results in the interlayer insulating layers 41a" to 41d" and the conductive layers 42a" to 42d" becoming the interlayer insulating layers 41a to 41d and the conductive layers 42a to 42d that have a shape further divided in the Y direction.

Figure 13:
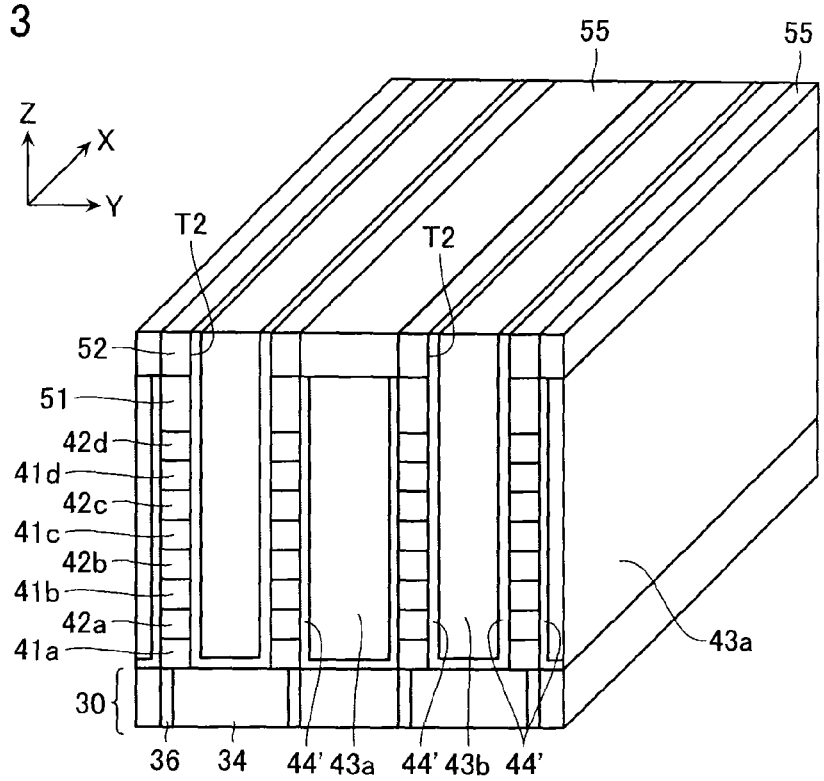
FIG. 13 is an example of a perspective view showing the first manufacturing method of the memory cell array 11 according to the first embodiment.

Following this, as shown in FIG. 13, the variable resistance layer 44' is formed on a side surface of the interlayer insulating layers 41a to 41d and the conductive layers 42a to 42d facing the trench T2 and on a bottom surface of the trench T2. Then, polysilicon (Si) is deposited to fill the trench T2, thereby forming the conductive layer 43b. Then, the conductive layer 43b is planarized and the sidewall mask 54 is removed by CMP.

Figure 14:
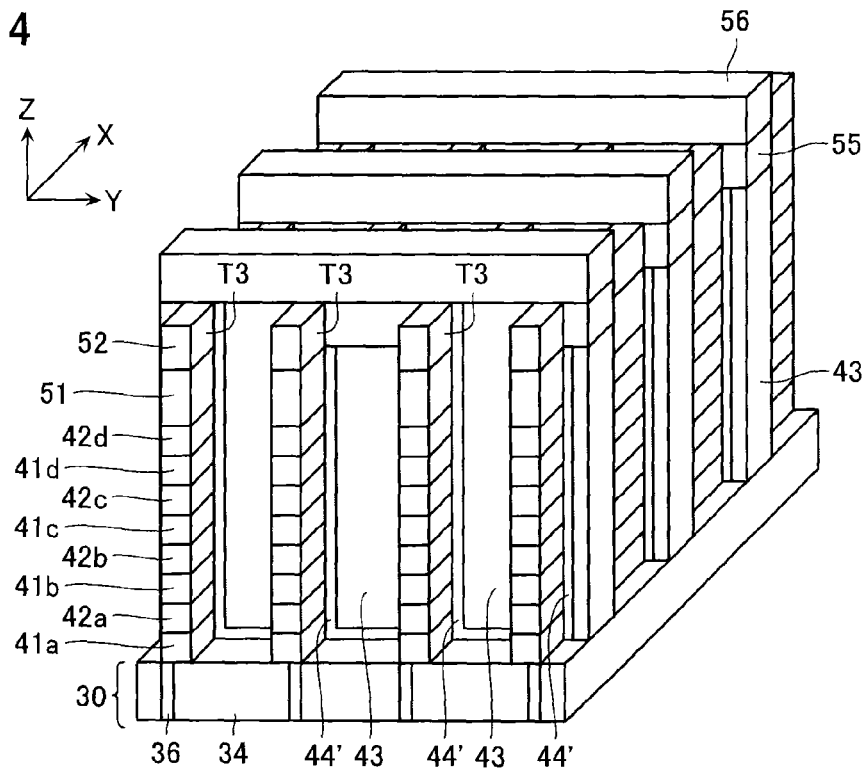
FIG. 14 is an example of a perspective view showing the first manufacturing method of the memory cell array 11 according to the first embodiment.

Next, as shown in FIG. 14, an etching mask 56 is further formed on the etching mask 55. The etching masks 56 are formed to be aligned with a certain pitch in the X direction and extend in the Y direction. Then, the conductive layers 43a and 43b and the variable resistance layer 44' are etched using this etching mask 56 and the insulating layer 52 as a mask to form a trench T3. This trench T3 results in the conductive layers 43a and 43b becoming the second conductive layer 43 that has a columnar shape extending in the Z direction. That results in completion of the memory layer 40 having the structure shown in FIGS. 3 and 4.

[Read Operation]

Figure 15:
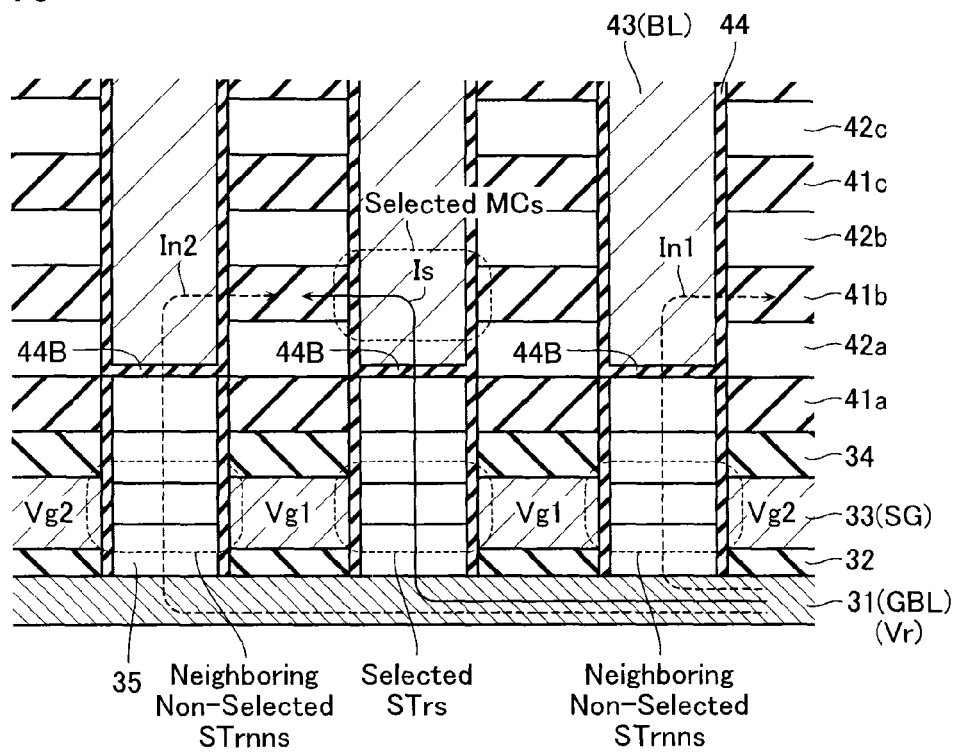
FIG. 15 is an example of a schematic view showing current flowing in a read operation in the first embodiment.

Next, a read operation in the semiconductor memory device of this first embodiment will be described with reference to FIG. 15. The case where the memory cell MC surrounded by a dotted line in FIG. 15 is adopted as a selected memory cell MCs will be described here as an example.

In this case, the global bit line GBL connected to the bit line BL connected to the selected memory cell MCs is applied with a voltage Vr.

In addition, select gates on both sides of the select transistor STrs, which are connected to the bit line BL connected to the selected memory cell MCs, are applied with a voltage Vg1, whereby the selected select transistor STrs turns on. Then, a select current Is flows in the selected memory cell MCs from the global bit line GBL via the select transistor STrs and the bit line BL.

On the other hand, a non-selected transistor STr adjacent to the selected select transistor STrs (referred to below as a "neighboring non-selected transistor STrnns") has a select gate on one side only applied with the voltage Vg1 and has a select gate on the other side applied with a voltage Vg2 which is a voltage smaller than the voltage Vg1. As a result, non-select currents In1 and In2 flowing in the neighboring non-selected transistor STrnns (leak currents) are smaller than the previously mentioned select current Is. Note that although not illustrated in FIG. 15, a non-selected select transistor STr that is not adjacent to the selected select transistor STrs has the select gate line SG on both sides applied with the voltage Vg2. Then, the non-selected select transistor STr turns off, a leak current flowing in the non-selected select transistor STr is smaller than the non-select currents In1 and In2.

When these non-select currents In1 and In2 become large in comparison to the select current Is, it becomes difficult to accurately detect the select current Is, then the possibility of a misreading of data is increased.

Therefore, the semiconductor memory device of the present embodiment comprises the non-linear resistance layer 44B between the semiconductor layer 35 as the select transistor STr and the second conductive layer 43 as the bit line BL. This non-linear resistance layer 44B makes the non-select currents In1 and In2 relatively small, it is possible to reduce the possibility of a misreading of data.

Figure 16:
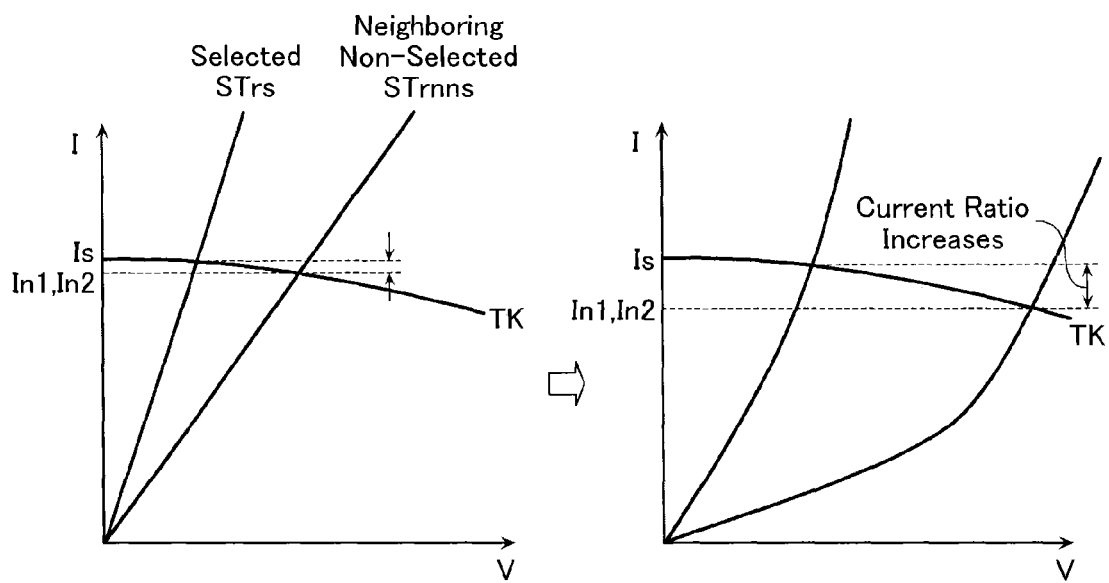
FIG. 16 is an example of a graph showing current flowing in the read operation in the first embodiment.

The graph on the left side of FIG. 16 is a graph showing a relationship between the select current Is and the non-select currents In1 and In2 in the case where this non-linear resistance layer 44B is not present. The horizontal axis of the graph of FIG. 16 indicates a global bit line voltage applied to the global bit line GBL. Moreover, the graph on the left side of FIG. 16 shows the case where the selected word line is applied to 0 V.

In FIG. 16, a load curve TK shows a resistance curve of a resistance changing film RW in the case where the selected cell is in a low-resistance state. Since the non-linear resistance layer 44B is not present, a select current characteristic and a non-select current characteristic both have a characteristic substantially proportional to the global bit line voltage. Therefore, the non-select currents In1 and In2 that are determined by an intersection point of the non-select current characteristic and a load curve attain a value is almost of no difference from the select current Is that is determined by an intersection point of the select current characteristic and the load curve.

On the other hand, the graph on the right side of FIG. 16 is a graph showing a relationship between the select current Is and the non-select currents In1 and In2 in the case where this non-linear resistance layer 44B is present. Since the non-linear resistance layer 44B is present, a select current characteristic and a non-select current characteristic both have a characteristic where the current increases non-linearly with respect to increase in the global bit line voltage. A material having a non-linear voltage-current characteristic like the non-linear resistance layer 44B has a property that the lower the voltage becomes, the higher the resistance value becomes. Now, since the select transistor and the non-linear resistance layer 44B are connected in series, a voltage applied to the non-linear resistance layer 44B is smaller when the select transistor STr is the neighboring non-selected transistor STrnns than when the select transistor STr is the select transistor STrs. Therefore, a current-voltage curve of the neighboring non-selected transistor STrnns has a more strongly non-linear characteristic than a current-voltage curve of the select transistor STrs. Accordingly, a current difference between the select current Is and the non-select currents In1 and In2 can be made larger compared to the case where the non-linear resistance layer 44B is not present. As a result, the probability of a misread occurring during the read operation can be reduced.

Second Embodiment

Next, a semiconductor memory device according to a second embodiment will be described with reference to FIG. 17. This embodiment has a stacked structure of the memory cell array 11 that differs from that of the first embodiment. In other respects, including also the overall configuration (FIG. 1), this embodiment is identical to the first embodiment, hence duplicated descriptions are omitted below.

Figure 17:
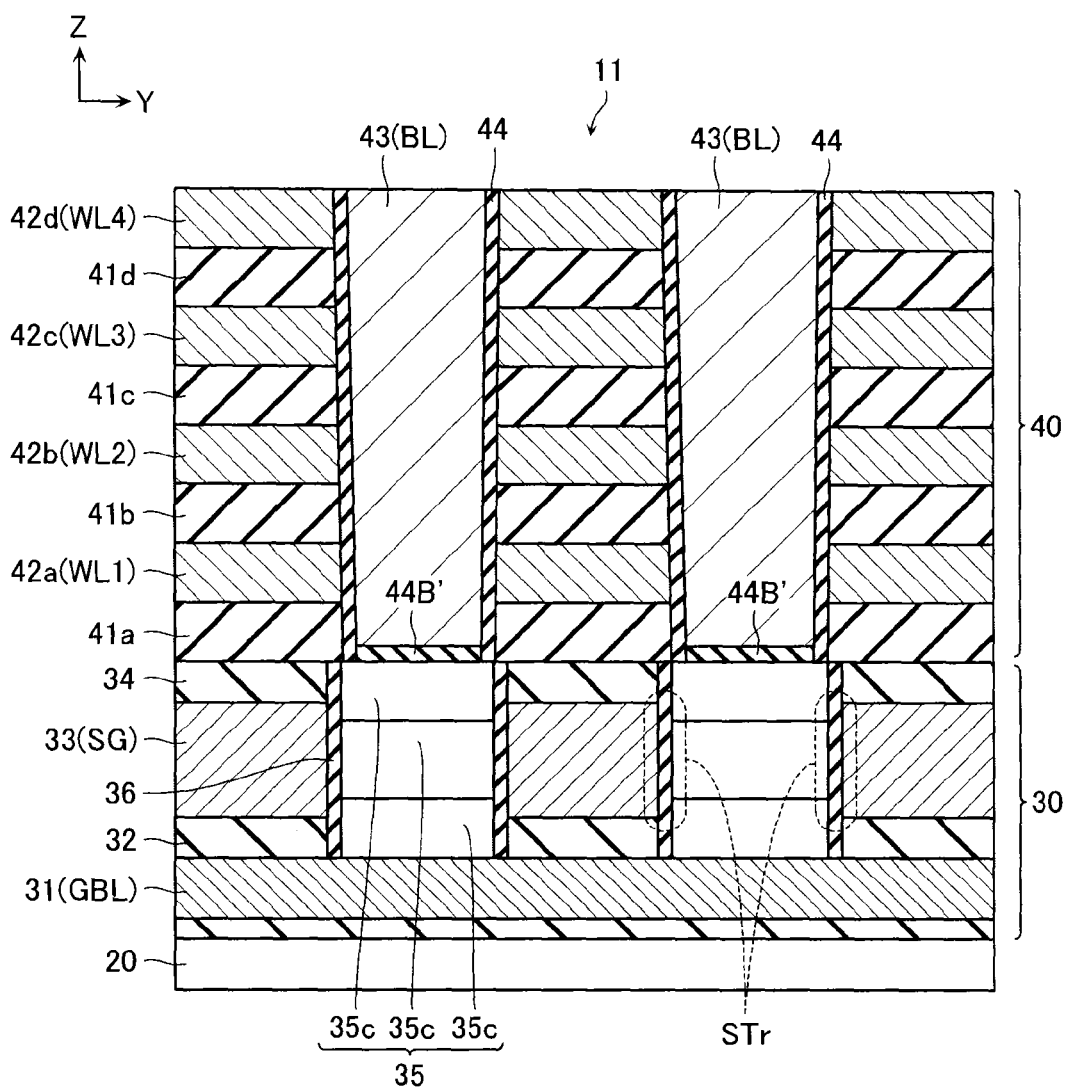
FIG. 17 is an example of a cross-sectional view showing a stacked structure of a memory cell array 11 according to a second embodiment.

FIG. 17 is an example of a cross-sectional view showing a stacked structure of a memory cell array 11 in the semiconductor memory device according to the second embodiment. The memory cell array 11 of this second embodiment differs from that of the first embodiment in comprising a non-linear resistance layer 44B' on a bottom portion of the second conductive layer 43 forming the bit line BL. The non-linear resistance layer 44B' of the second embodiment is formed of a different material to that of the memory-dedicated variable resistance layer 44 and is formed by a different process to that by which the variable resistance layer 44 is formed. As an example, when the variable resistance layer 44 is formed of hafnium oxide (HfOx), the non-linear resistance layer 44B' may be formed from a different material to this, for example, tantalum oxide (TaOx).

Forming the non-linear resistance layer 44B' between the select transistor STr (columnar semiconductor 35) and the bit line BL (second conductive layer 43) in this way enables similar advantages to those of the first embodiment to be obtained. In addition, the material of the non-linear resistance layer 44B' can be selected separately to that of the variable resistance layer 44. As a result, it becomes possible to select a material of the non-linear resistance layer 44B' that increases the difference between the select current Is and the non-select currents In1 and In2, without changing characteristics of the variable resistance layer 44.

Forming the non-linear resistance layer 44B' by a different process to that by which the variable resistance layer 44 is formed enables a film thickness of the non-linear resistance layer 44B' to be independently controlled. Therefore, the second embodiment makes it possible to increase the difference between the select current Is and the non-select currents In1 and In2.

In addition, the non-linear resistance layer 44B' may be part of a resistance adjusting layer or barrier metal contacting the variable resistance layer 44. As a result, the difference between the select current Is and the non-select currents In1 and In2 can be increased while improving characteristics of the variable resistance layer 44 by the resistance adjusting layer and so on.

Third Embodiment

Next, a semiconductor memory device according to a third embodiment will be described with reference to FIG. 18. Regarding identical elements including the overall configuration (FIG. 1), duplicated descriptions are omitted below.

Figure 18:
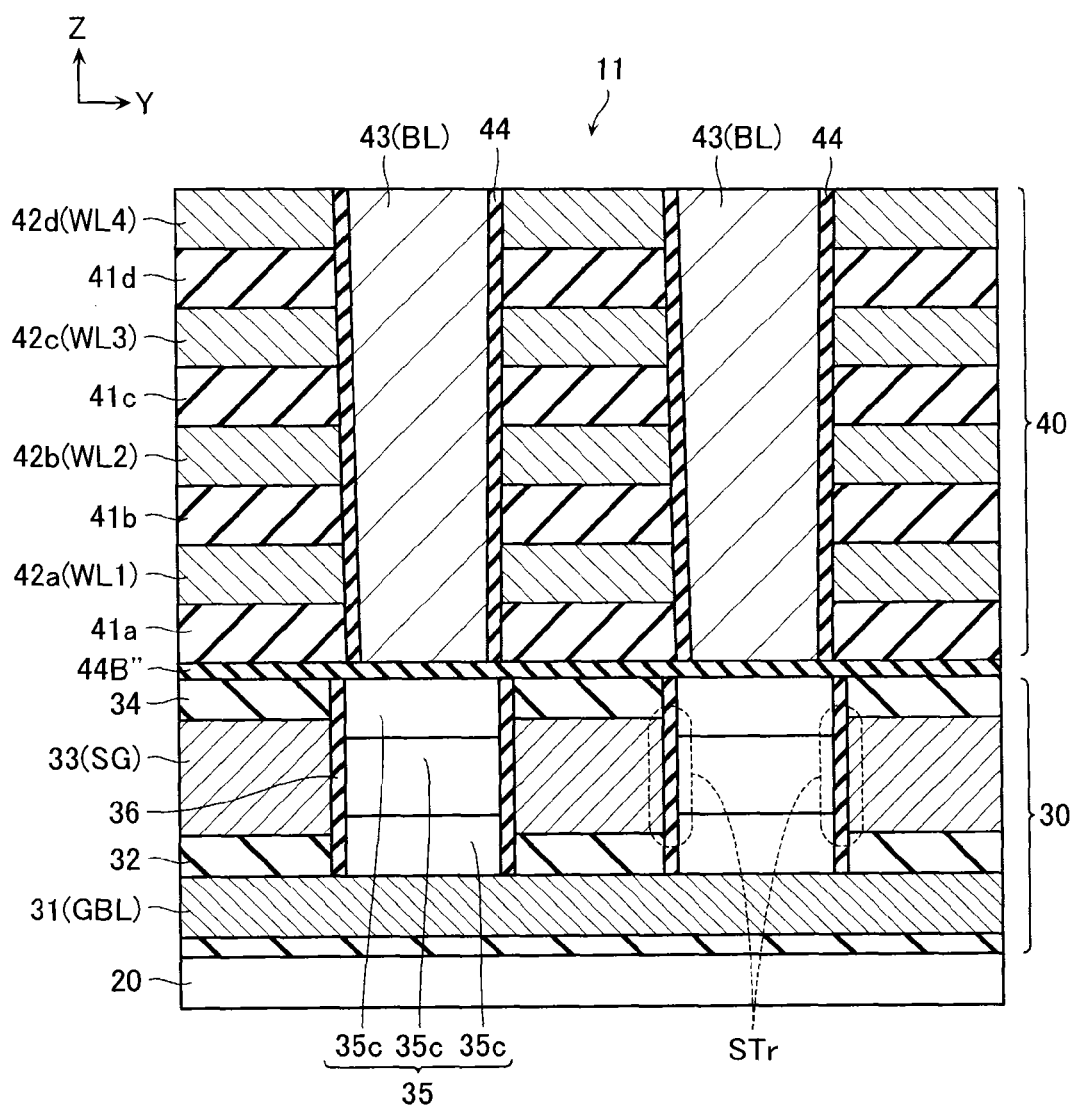
FIG. 18 is an example of a cross-sectional view showing a stacked structure of a memory cell array 11 according to a third embodiment.

FIG. 18 is an example of a cross-sectional view showing a stacked structure of a memory cell array 11 in the semiconductor memory device according to the third embodiment. A non-linear resistance layer 44B" of this embodiment is formed on an entire surface above the select transistor layer 30. That is, the non-linear resistance layer 44B" is formed also between the interlayer insulating layer 41a and the interlayer insulating layer 34. Moreover, since the non-linear resistance layer 44B' is formed on the entire surface above the select transistor layer 30, control of thickness of the non-linear resistance layer 44B" is easier compared to control of thickness of the non-linear resistance layer 44B' formed only on the bottom portion of the trench.

Fourth Embodiment

Next, a semiconductor memory device according to a fourth embodiment will be described with reference to FIG. 19A. Regarding identical elements including the overall configuration (FIG. 1), duplicated descriptions are omitted below.

Figure 19A:
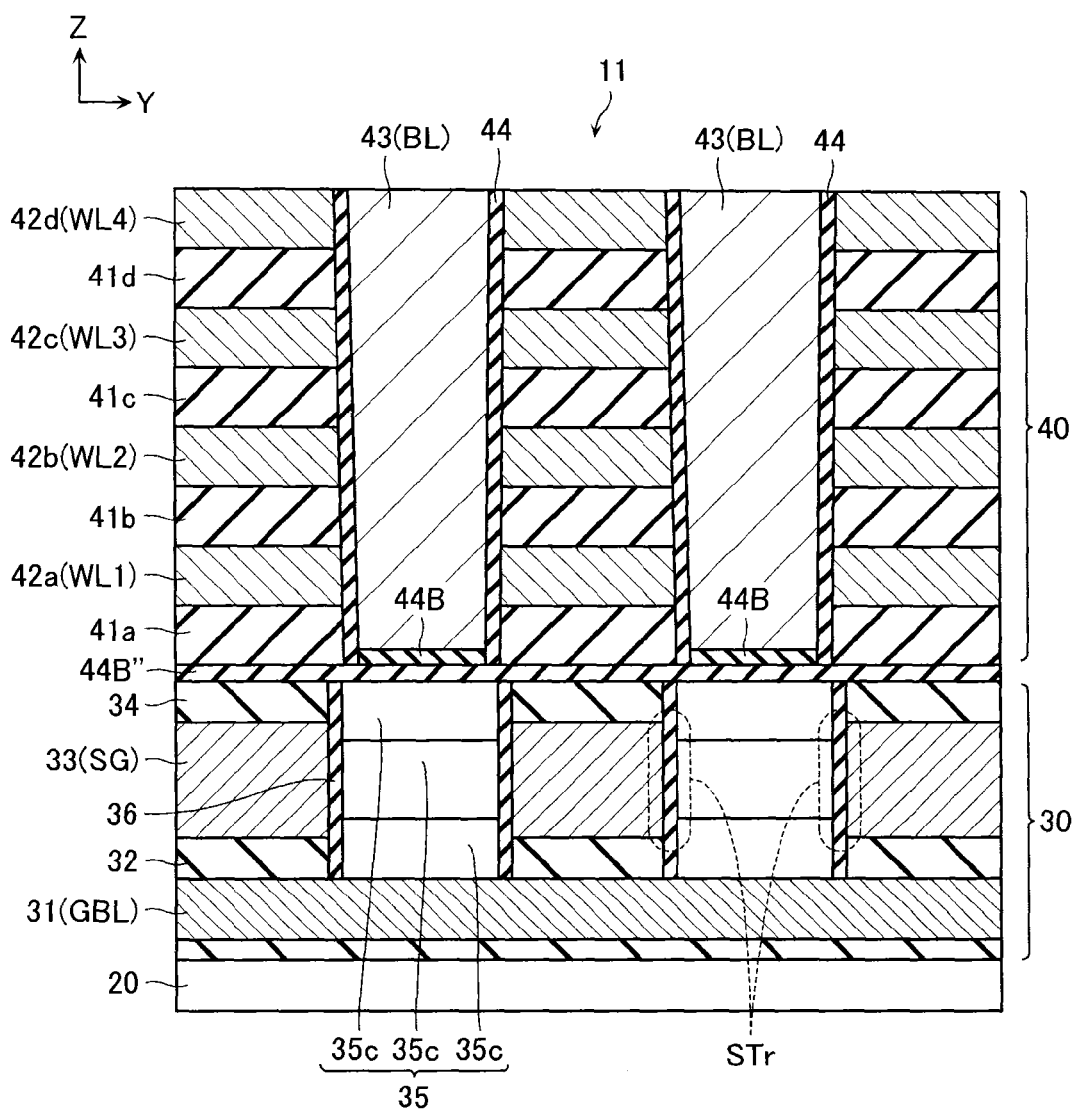
FIGS. 19A and 19B are each an example of a cross-sectional view showing a stacked structure of a memory cell array 11 according to a fourth embodiment.

FIG. 19A is an example of a cross-sectional view showing a stacked structure of a memory cell array 11 in the semiconductor memory device according to the fourth embodiment. In this embodiment, the non-linear resistance layer 44B as part of the variable resistance layer 44 is further formed on this non-linear resistance layer 44B". Inserting two layers of non-linear layers between the second conductive layer 43 and the semiconductor layer 35 enables the voltage-current characteristic to be made more non-linear.

Figure 19B:
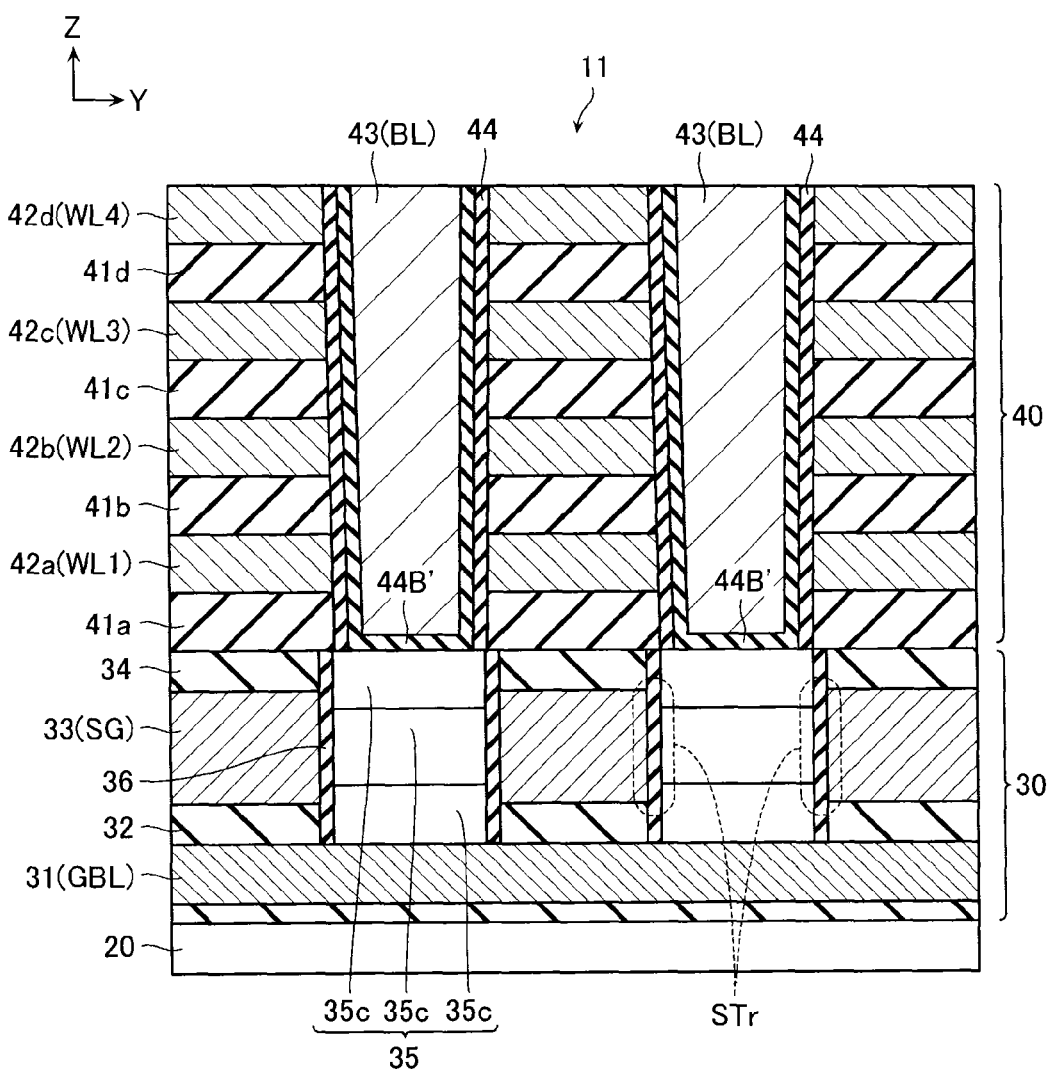

Note that as shown in FIG. 19B, the non-linear resistance layer 44B may be formed not only on the bottom portion of the second conductive layer 43 (bit line BL) but also on the side surface of the second conductive layer 43.

Fifth Embodiment

Next, a semiconductor memory device according to a fifth embodiment will be described with reference to FIG. 20A. Regarding identical elements including the overall configuration (FIG. 1), duplicated descriptions are omitted below.

Figure 20A:
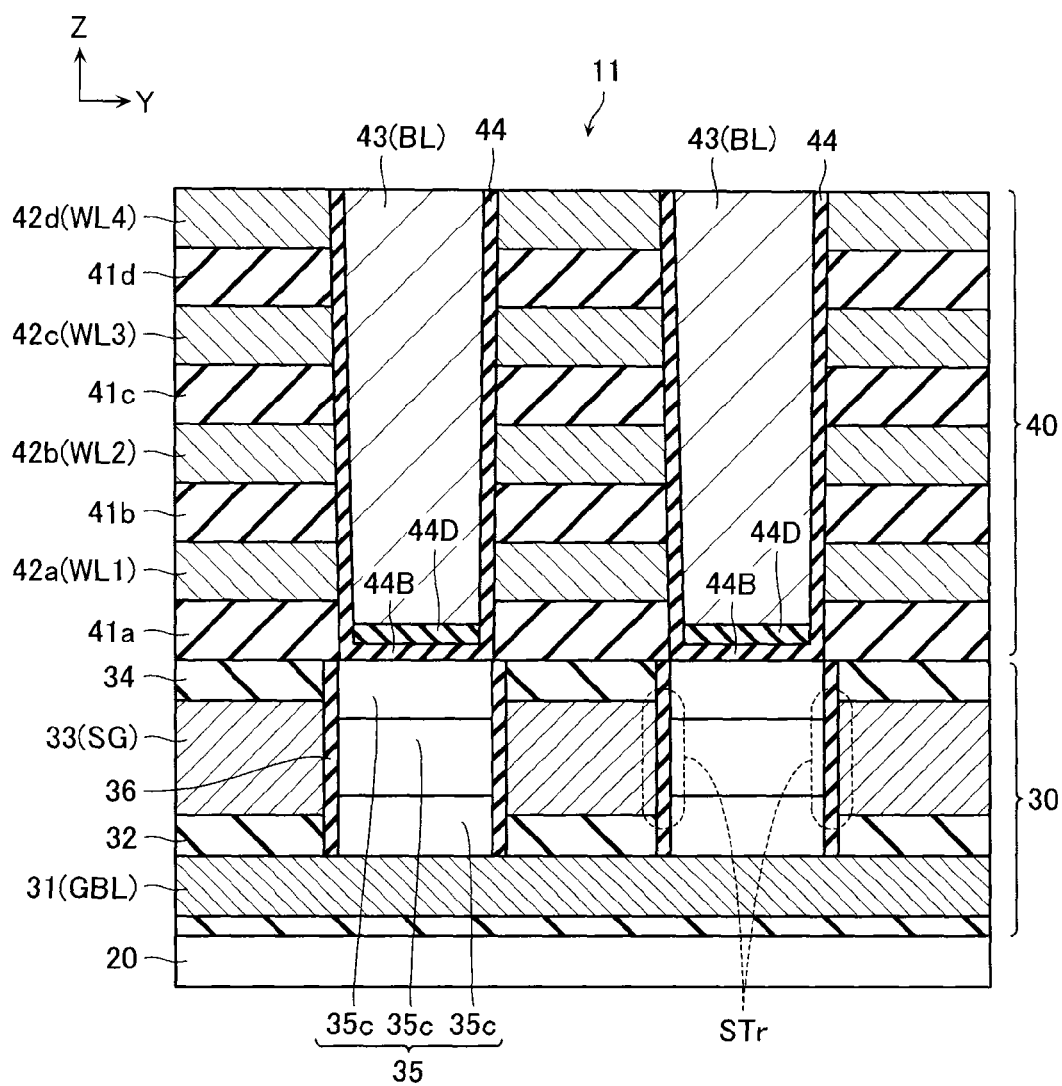
FIGS. 20A and 20B are each an example of a cross-sectional view showing a stacked structure of a memory cell array 11 according to a fifth embodiment.

FIG. 20A is an example of a cross-sectional view showing a stacked structure of a memory cell array 11 in the semiconductor memory device according to the fifth embodiment. The memory cell array 11 of this fifth embodiment further comprises a different non-linear resistance layer 44D in a layer above the non-linear resistance layer 44B formed in an integrated manner with the variable resistance layer 44. This configuration enables identical advantages of the first embodiment.

In addition, the non-linear resistance layer 44D may be part of a resistance adjusting layer or barrier metal contacting the variable resistance layer 44. As a result, the difference between the select current Is and the non-select currents In1 and In2 can be increased while improving characteristics of the variable resistance layer 44 by the resistance adjusting layer and so on.

Figure 20B:
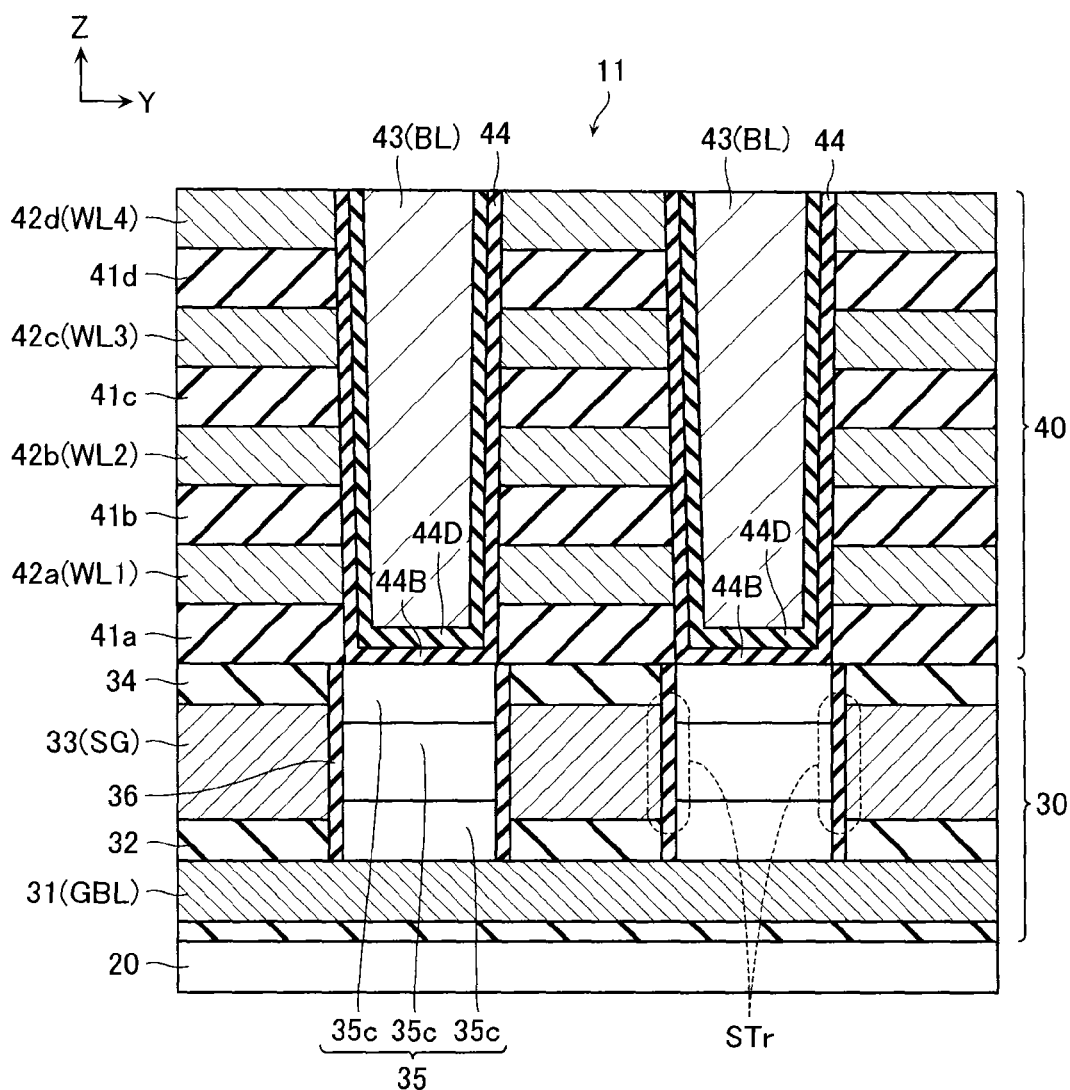

Note that as shown in FIG. 20B, the non-linear resistance layer 44D may be formed not only on the bottom portion of the second conductive layer 43 (bit line BL) but also on the side surface of the second conductive layer 43.

Sixth Embodiment

Figure 21:
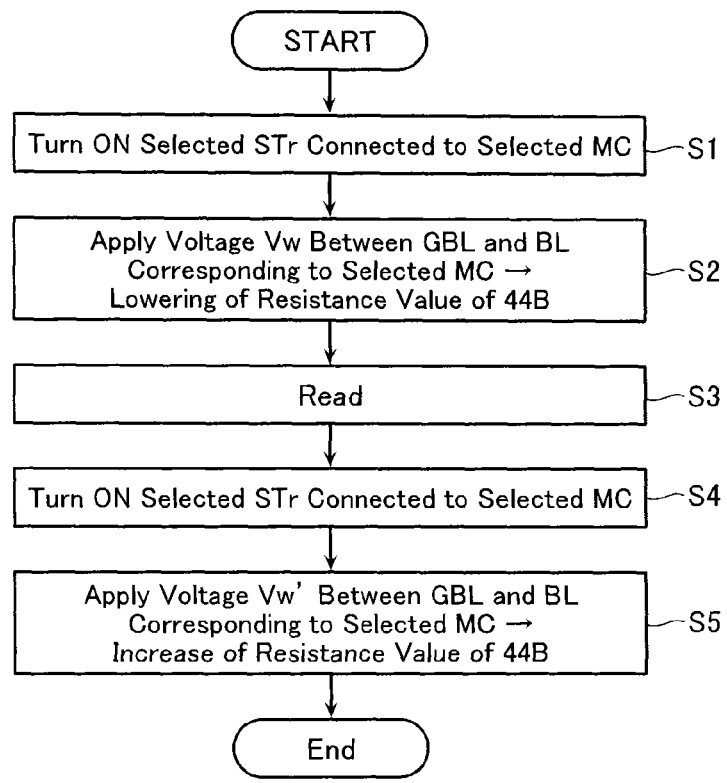
FIG. 21 is an example of a flowchart showing a procedure of a read operation of a nonvolatile semiconductor memory device according to a sixth embodiment.

Next, a semiconductor memory device according to a sixth embodiment will be described with reference to FIGS. 21 and 22. In this sixth embodiment, any of the structures of the memory cell array in the previously described embodiments can be employed (In FIGS. 21 and 22, a memory cell array having the structure of the first embodiment is described as an example). However, in this embodiment, operation when performing the read operation is different from that in the previously described embodiments, and that operation is executed by a control circuit included in a circuit of FIG. 1.

In the read operation in this embodiment, prior to the read operation of the selected memory cell MCs, only the resistance value of the non-linear resistance layer 44B connected to the bit line BL connected to that selected memory cell MCs (selected bit line BLs) is lowered, and the resistance value of the non-linear resistance layer 44B connected to the non-selected bit lines BLns other than the selected bit line BLs maintains a high state. Then, the read operation is performed. By so doing, a function of the non-linear resistance layer 44B as a selection element improves, and it is possible to suppress the probability of occurrence of a misreading of data in the read operation. Note that in the second embodiment, and so on, the non-linear resistance layer 44B' is formed of a material different from that of the resistance varying layer 44. However, the non-linear resistance layer 44B' may have its resistance value change by a voltage, and it is possible to be applied to the present embodiment.

A specific procedure of the read operation will be described according to the flowchart of FIG. 21. As shown in FIG. 21, when the read operation is started, the select transistor STr connected to the selected memory cell MC selected as a target of the read operation is selected, and the two select gate lines of this select transistor STr are applied to the voltage Vg1. As a result, the selected select transistor STr turns on (ON) (S1). Note that the select gates of the non-selected other select transistors STr are provided to the voltage Vg2 which is lower than the voltage Vg1, whereby those select transistors STr are substantively turns off (maintained in a non-conductive state).

Following this, a voltage Vw is applied between the global bit line GBL corresponding to the selected memory cell MC (the global bit line GBL connected to the selected memory cell MC via the bit line BL and the select transistor STr) and the bit line BL (S2). This voltage Vw may be set to a voltage being substantially equal to the write voltage in the write operation (setting operation) to the memory cell. Note that voltage Vw may differ according to the number of stacked layers of the word line, and so on. As a result, the non-linear resistance layer 44B of the selected bit line BL changes from a high-resistance state (High) to a low-resistance state (Low).

Figure 22:
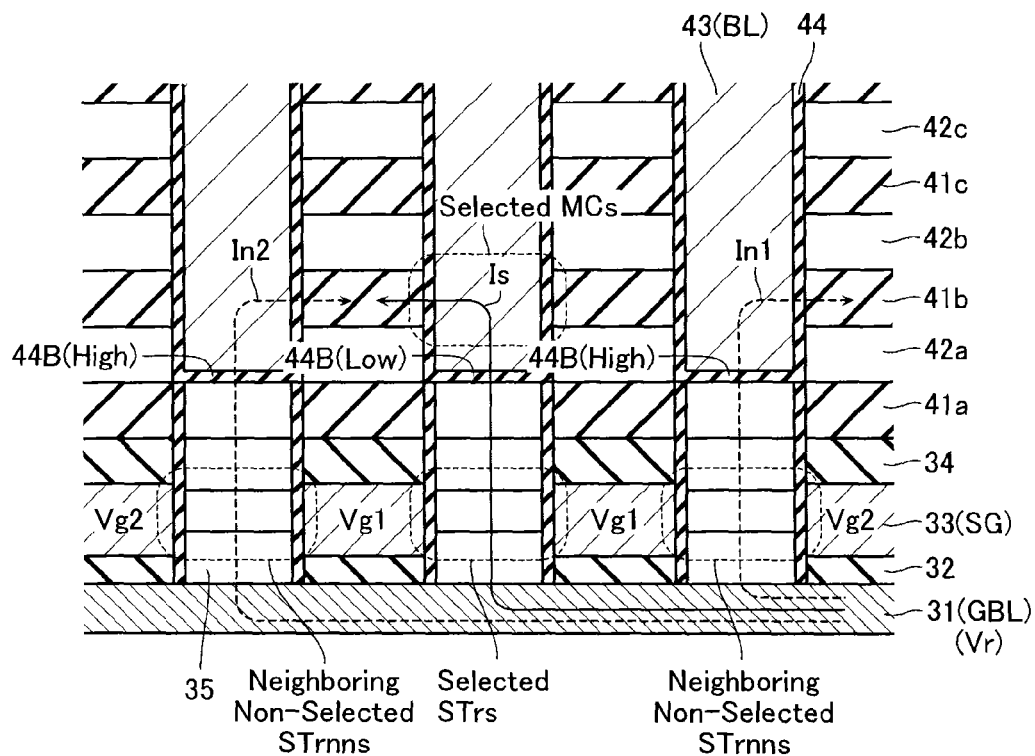
FIG. 22 is an example of a schematic view explaining the read operation in the sixth embodiment.

By so doing, only the non-linear resistance layer 44B corresponding to the selected memory cell MC is changed to a low-resistance state, and then, as shown in FIG. 22, a read operation similar to that of the first embodiment is executed (S3). As a result of steps S1 and S2, only the resistance value of the non-linear resistance layer 44B corresponding to the selected memory cell MC is made low-resistance, hence the non-linear characteristic of the non-linear resistance layer 44B as a selection element is strengthened compared to when in a high-resistance state. Therefore, the current ratio of the select current Is and the non-select currents In1 and In2 can be made large.

Then, when the read operation finishes, similarly to in step S1, the select transistor STr connected to the selected memory cell MC selected as a target of the read operation is switched to a conductive state (ON) (S4). Then, substantially similarly to in step S2, a voltage Vw' is applied between the global bit line GBL and the bit line BL, thereby changing the non-linear resistance layer 44B from a low-resistance state (Low) to a high-resistance state (High) (S5). As a result, the read operation finishes.

[Other]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the above-described embodiments described a structure where two adjacent select transistors STr share one select gate line SG. However, the present invention is not limited to this structure, and it is also possible to adopt a configuration where one select gate line is connected to every single select transistor STr.

What is claimed is:

1. A semiconductor memory device, comprising:
a memory cell array including: a first conductive line, the first conductive line extending in a first direction; second conductive lines, the second conductive lines extending in a second direction intersecting the first direction; a variable resistance element, the variable resistance element being disposed at an intersection of the first conductive line and the second conductive lines and disposed between the first conductive line and the second conductive lines; a third conductive line, the third conductive line extending in a third direction intersecting the first direction; and a select transistor, the select transistor including a gate electrode, a gate insulating film, and a semiconductor layer,
the semiconductor layer disposed between an end of the first conductive line at a side in the first direction and the third conductive line; and
a non-linear resistance layer disposed between the end of the first conductive line at the side in the first direction and the semiconductor layer, the non-linear resistance layer being configured from a non-linear material.

2. The semiconductor memory device according to claim 1, wherein
the non-linear resistance layer is formed of a material identical to that of the variable resistance element.

3. The semiconductor memory device according to claim 1, wherein
the non-linear resistance layer is formed of an oxide of any of Hf, Al, Ti, Ni, W, and Ta.

4. The semiconductor memory device according to claim 1, wherein
the non-linear resistance layer is formed of a material different from a material of the variable resistance element.

5. The semiconductor memory device according to claim 4, wherein
the variable resistance element is formed of HfOx, and
the non-linear resistance layer is formed of TaOx.

6. The semiconductor memory device according to claim 1, further comprising:
a control circuit,
wherein the control circuit is configured to, before a read operation, execute a first operation for changing the non-linear resistance layer from a first resistance state to a second resistance state.

7. The semiconductor memory device according to claim 6, wherein
the control circuit is configured to, after finishing the read operation, execute a second operation for changing the non-linear resistance layer from the second resistance state to the first resistance state.

8. A semiconductor memory device, comprising:
a memory cell array including: a first conductive line, the first conductive line extending in a first direction; second conductive lines, the second conductive line extending in a second direction intersecting the first direction; a variable resistance element, the variable resistance element being disposed at an intersection of the first conductive line and the second conductive lines and disposed between the first conductive line and the second conductive lines; a third conductive line, the third conductive line extending in a third direction intersecting the first direction; and a select transistor, the select transistor including a gate electrode, a gate insulating film, and a conductive layer,
the conductive layer disposed between an end of the first conductive line at a side in the first direction and the third conductive line; and
a non-linear resistance layer disposed between the end of the first conductive line at the side in the first direction and the conductive layer, the non-linear resistance layer having a non-linear voltage-current characteristic stronger than that of the first conductive line.

9. The semiconductor memory device according to claim 8, wherein
the non-linear resistance layer is formed of a material identical to that of the variable resistance element.

10. The semiconductor memory device according to claim 8, wherein
the non-linear resistance layer is formed of an oxide of any of Hf, Al, Ti, Ni, W, and Ta.

11. The semiconductor memory device according to claim 8, wherein
the non-linear resistance layer is formed of a material different from a material of the variable resistance element.

12. The semiconductor memory device according to claim 11, wherein
the variable resistance element is formed of HfOx, and
the non-linear resistance layer is formed of TaOx.

13. The semiconductor memory device according to claim 8, further comprising:
a control circuit,
wherein the control circuit is configured to,
before a read operation, execute a first operation for changing the non-linear resistance layer from a first resistance state to a second resistance state.

14. The semiconductor memory device according to claim 13, wherein
the control circuit is configured to, after finishing the read operation, execute a second operation for changing the non-linear resistance layer from the second resistance state to the first resistance state.

15. The semiconductor memory device according to claim 1, further comprising:
a substrate, wherein
the first conductive line is disposed above the substrate, and the first direction is perpendicular to a surface of the substrate.

16. The semiconductor memory device according to claim 8, further comprising:
a substrate, wherein
the first conductive line is disposed above the substrate, and the first direction is perpendicular to a surface of the substrate.

* * * * *